United States Patent
Lim et al.

(10) Patent No.: US 8,548,761 B2
(45) Date of Patent: Oct. 1, 2013

(54) METHOD FOR MEASURING SOC OF A BATTERY MANAGEMENT SYSTEM AND THE APPARATUS THEREOF

(75) Inventors: Jae Hwan Lim, Daejeon (KR); Shanshan Jin, Daejeon (KR); Sekyung Han, Gyeonggi-do (KR)

(73) Assignee: SK Innovation Co., Ltd., Seoul (KR)

( * ) Notice: Subject to any disclaimer, the term of this patent is extended or adjusted under 35 U.S.C. 154(b) by 393 days.

(21) Appl. No.: 12/812,163

(22) PCT Filed: Jan. 12, 2009

(86) PCT No.: PCT/KR2009/000161
§ 371 (c)(1),
(2), (4) Date: Jul. 8, 2010

(87) PCT Pub. No.: WO2009/088271
PCT Pub. Date: Jul. 16, 2009

(65) Prior Publication Data
US 2010/0283471 A1   Nov. 11, 2010

(30) Foreign Application Priority Data

Jan. 11, 2008 (KR) .................. 10-2008-0003345
Sep. 26, 2008 (KR) .................. 10-2008-0094481

(51) Int. Cl.
    *G01R 31/36* (2006.01)
(52) U.S. Cl.
    USPC ................ 702/63; 702/64; 324/426; 320/132
(58) Field of Classification Search
    USPC ........ 702/60, 63, 64; 324/426, 427; 320/132
    See application file for complete search history.

(56) References Cited

U.S. PATENT DOCUMENTS

| | | | |
|---|---|---|---|
| 4,958,127 | A * | 9/1990 | Williams et al. .............. 324/426 |
| 6,359,419 | B1 | 3/2002 | Verbrugge et al. |
| 6,828,759 | B1 | 12/2004 | Xiong et al. |

(Continued)

FOREIGN PATENT DOCUMENTS

| EP | 1353191 A2 | 10/2003 |
|---|---|---|
| EP | 1442909 A1 | 8/2004 |

(Continued)

OTHER PUBLICATIONS

Machine translation of Korean patent document 10-2005-0061123.*

*Primary Examiner* — Sujoy Kundu
*Assistant Examiner* — Harun Chowdhury
(74) *Attorney, Agent, or Firm* — The Webb Law Firm

(57) ABSTRACT

This invention is related to a method and an apparatus for choosing SOCi (State Of Charge based on current) or SOCv (State Of Charge based on voltage) as the SOC (State Of Charge) of a battery depending on a condition in a battery management system by using an equivalent circuit model. In this invention, a method for measuring SOC of a battery in a battery management system is characterized by comprising the steps of: obtaining voltage data and temperature by measuring the current, voltage and temperature of a battery; calculating SOCi by accumulating the current data; calculating open circuit voltage by using an equivalent circuit model which simply presents the current data, the voltage data and the battery through an electric circuit; calculating SOCv by using the temperature data and the open circuit voltage; and choosing at least one of the SOCi and the SOCv as SOC of the battery by using the SOCi and the SOCv based on the judgment on the current state of a vehicle for a certain time interval.

15 Claims, 8 Drawing Sheets

(56) References Cited

U.S. PATENT DOCUMENTS

| | | |
|---|---|---|
| 7,009,402 B2 | 3/2006 | Yumoto et al. |
| 7,098,625 B2 | 8/2006 | Yumoto et al. |
| 7,352,156 B2 * | 4/2008 | Ashizawa et al. ............ 320/132 |
| 7,358,704 B2 * | 4/2008 | Yumoto et al. ............... 320/132 |
| 2003/0097225 A1 | 5/2003 | Teruo |
| 2003/0195719 A1 | 10/2003 | Emori et al. |
| 2004/0162683 A1 | 8/2004 | Verbrugge et al. |
| 2007/0005276 A1 * | 1/2007 | Cho et al. ........................ 702/60 |
| 2007/0029973 A1 | 2/2007 | Ashizawa et al. |

FOREIGN PATENT DOCUMENTS

| | | | |
|---|---|---|---|
| EP | 1674877 A1 | | 6/2006 |
| EP | 1707974 A1 | | 10/2006 |
| JP | 200733112 A | | 2/2007 |
| JP | 200747117 A | | 2/2007 |
| KR | 10-2005-0061123 | * | 1/2007 |
| KR | 1020070006953 A | | 1/2007 |

* cited by examiner (a)　　　　　　　　　　　(b)

METHOD FOR MEASURING SOC OF A BATTERY MANAGEMENT SYSTEM AND THE APPARATUS THEREOF

TECHNICAL FIELD

The present invention relates to a method for measuring SOC (State Of Charge) of a battery in a battery management system and an apparatus thereof, and more particularly, to a method for setting up SOCi (State Of Charge based on current) or SOCv (State Of Charge based on voltage) to SOC of a battery in a battery management system according to a desired condition using a simple equivalent circuit, and an apparatus thereof.

BACKGROUND ART

An automobile with an internal combustion engine using gasoline or heavy oil generally has a serious influence on the generation of pollution like atmospheric pollution. Therefore, in order to reduce the generation of pollution, there have been many efforts to develop a hybrid vehicle or an electric vehicle.

Recently, there has developed a high power secondary battery using a high energy density non-aqueous electrolyte. The high power secondary battery may be provided in plural and connected in series in order to form a high capacity secondary battery.

As described above, the high capacity secondary battery (hereinafter, called "battery") is typically comprised of the plurality of secondary batteries connected in series. In case of the battery, particularly, an HEV battery, since a few or a few ten secondary batteries are alternately charged and discharged, there is a necessity of managing the battery to control the charging and discharging of the battery and maintain the battery in an appropriate operation state.

To this end, there is provided BMS (Battery Management System) for managing all the states of the battery. The BMS detects voltage, current, temperature or the like, estimates SOC through a calculating operation and controls the SOC so as to optimize the fuel consumption efficiency of a vehicle. In order to precisely control the SOC, it is necessary to exactly measure the SOC of the battery in the charging and discharging operations are carried out.

As a prior art, there is disclosed Korean Patent Application No. 2005-0061123 (filed on Jul. 7, 2005) entitled "Method for resetting SOC of secondary battery module".

In order to precisely calculate the SOC of the battery, the above-mentioned prior art includes measuring a current value, a voltage value and a temperature vale of a battery module when turning on a switch, calculating initial SOC using the measured values, accumulating the current value, calculating actual SOC according to the accumulated current value, determining whether the battery module is in a no-load state, determining whether the actual SOC is within a setup range that can be measured by accumulating the current value if the battery module is in the no-load state, and calculating the SOC according to the voltage value by measuring the voltage value if the actual SOC is outside the setup range. However, the prior art does not disclose a method that applies a simple equivalent circuit to an actual battery and an apparatus thereof.

Generally, SOCi does not have errors in the short term, but, as shown in FIG. 1, there is a tendency that the errors are accumulated. Therefore, in case that the battery is operated for a long time, considerable error is occurred. Especially, the accumulative error is mostly generated when the charging or discharging of battery is completely achieved. This is caused by that the degree of precision is influenced by the errors occurred by reduction of SOC due to self-discharge, and omission of LBS digit of CPU for calculating the SOC. Further, since the precision degree of the SOC is largely dependent on a current measuring sensor, it is impossible to correct the errors when the sensor has a trouble.

However, as shown in FIG. 2, SOCv measures the SOC through an open circuit voltage. In this measuring method, it is possible to obtain very precise results when a current is not flowed. However, when the current is flowed, the precision degree of the SOCv is dependent on a charging and discharging pattern of a battery. Therefore, since the precision degree of the SOC is also dependent on the charging and discharging pattern, it is deteriorated. Furthermore, the charging and discharging pattern that deteriorates the precision degree of the SOCv is within a range that a typical battery is used. Thus, although only the SOCv is used, there is also a problem that has to accept the considerable error.

DISCLOSURE

Technical Problem

An object of the present invention is to provide a method for measuring SOC (State Of Charge) of a battery in a battery management system and an apparatus thereof, which uses a simple equivalent circuit model and an adaptive digital filter and thereby easily and precisely measure the SOC of the battery.

Another object of the present invention is to provide a method for measuring SOC (State Of Charge) of a battery in a battery management system and an apparatus thereof, which determines whether a low current state is maintained for a desired time period and then sets up SOCi (State Of Charge based on current) or SOCv (State Of Charge based on voltage) to SOC of the battery, thereby easily and precisely measuring the SOC of the battery.

Technical Solution

To achieve the object of the present invention, the present invention provides a method for measuring SOC of a battery in a battery management system, comprising obtaining current data, voltage data and temperature data by measuring current, voltage and temperature of the battery; calculating SOCi (State Of Charge based on current) by accumulating the current data; calculating OCV (Open Circuit Voltage) using an equivalent circuit model in which the current data, the voltage data and the battery are simply expressed by an electric circuit; calculating SOCv (State Of Charge based on voltage) using the temperature data and the OCV; and judging a current state of the battery for a desired period of time, and setting up the SOC of the battery using at least one of the SOCv and the SOCi.

Preferably, the calculating of OCV comprises filtering the current data and the voltage data using a low pass filter; calculating a parameter used in the equivalent circuit model by applying the filtered current data and voltage data to the equivalent circuit model and an adaptive digital filter; and calculating the OCV using the parameter.

Preferably, the low pass filter is a third order low pass filter, and the equivalent circuit model is expressed by an electric circuit using a resistance parameter R, a current parameter I, a capacitor parameter C, a terminal voltage parameter V and OCV parameter Vo, and the adaptive digital filter continuously renews a value of the parameter used in the equivalent circuit model.

Preferably, the SOCv is set up to the SOC of the battery, if the battery is in a low current state for the desired period of time, and the SOCv is set up to the SOC of the battery, if the battery is in other state, and the desired period of time is 20~60 seconds, and the low current criteria is 2 A, and also an integration model of the equivalent circuit model may replace the equivalent circuit model.

Further, the present invention provides a method for measuring SOC of a battery in a battery management system, comprising judging the current state of the battery for the desired period of time, and measuring target SOC of the battery using at least one of the SOCv and the SOCi; calculating $^{\Delta}$SOC which is a difference between the target SOC at a present time and the SOC at a previous time; comparing the $^{\Delta}$SOC with a first critical value; renewing the target SOC at the present time according to a predetermined algorithm and then setting up the renewed target SOC to the SOC of the battery at the present time, if the $^{\Delta}$SOC is larger than the first critical value; and setting up the target SOC at the present time to the SOC of the battery at the present time, if the $^{\Delta}$SOC is not larger than the first critical value.

Further, the present invention provides an apparatus for measuring SOC of a battery in a battery management system, comprising a battery information obtaining part that measures current, voltage and temperature of the battery and obtains current data, voltage data and temperature data; a current accumulating part that calculates SOCi by accumulating the current data; a OCV calculating part that calculates OCV using an equivalent circuit model in which the current data, the voltage data and the battery are simply expressed by an electric circuit; a SOCv estimating part that estimates SOCv using the temperature data and the OCV; and a SOC setting part that judges a current state of the battery for a desired period of time, and sets up the SOC of the battery using at least one of the SOCv and the SOCi.

Preferably, the apparatus for measuring SOC of the battery further comprises a low pass filtering part that filters the current data and the voltage data using a low pass filter, and the OCV calculating part applies the current data and the voltage data filtered by the low pass filtering part to the equivalent circuit model and an adaptive digital filter, calculates a parameter used in the equivalent circuit model and then calculates the OCV using the parameter.

Further, the present invention provides a computer-readable recording medium which records a program for executing one of the methods.

Advantageous Effects

The present invention easily and precisely measures the SOC of the battery by using the simple equivalent circuit model and the adaptive digital filter.

Further, the present invention determines whether the low current state is maintained for a desired time period and then sets up the SOC of the battery using at least one of the SOCi and the SOCv, thereby easily and precisely measuring the SOC of the battery.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

100: current accumulating part
200: low pass filtering part
300: open circuit voltage calculating part
400: SOCv estimating part
500: SOC setting part

BEST MODE

Various terms used in the application are generally described in this field, but in a special case, some terms are optionally selected by the applicant. In this case, the meanings thereof are defined in the description of the present invention. Therefore, the invention should be understood with the meanings of the terms, but not names thereof.

Hereinafter, the embodiments of the present invention will be described in detail with reference to accompanying drawings.

Figure 1:
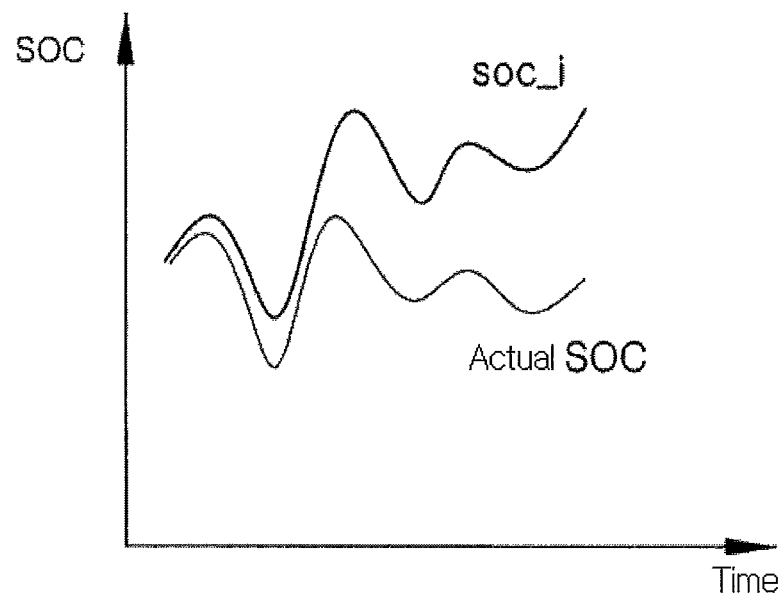
FIG. 1 is a graph showing a case that SOC of a battery is set up by using conventional SOCi.
Figure 2:
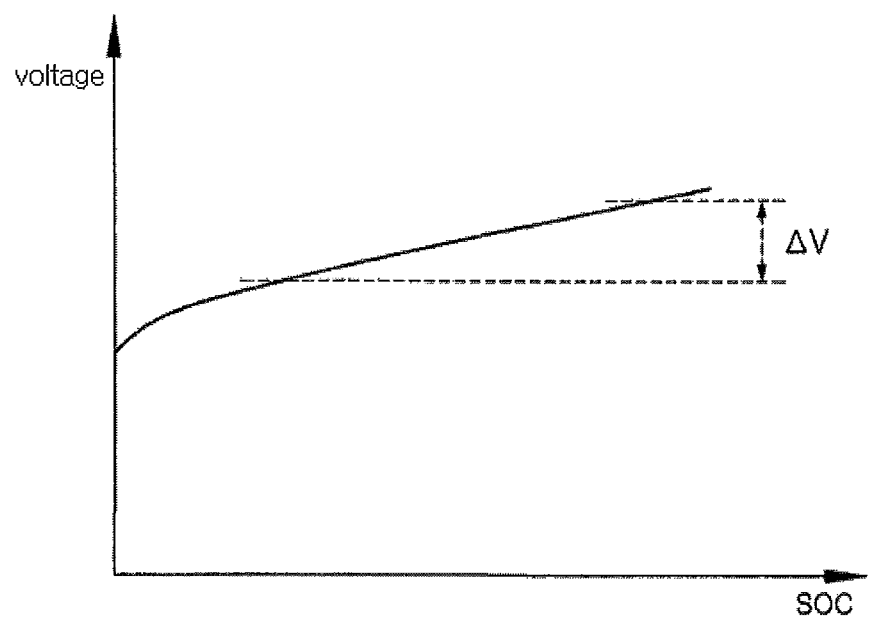
FIG. 2 is a schematic view showing a case that the SOC of the battery is set up by using conventional SOCv.
Figure 3:
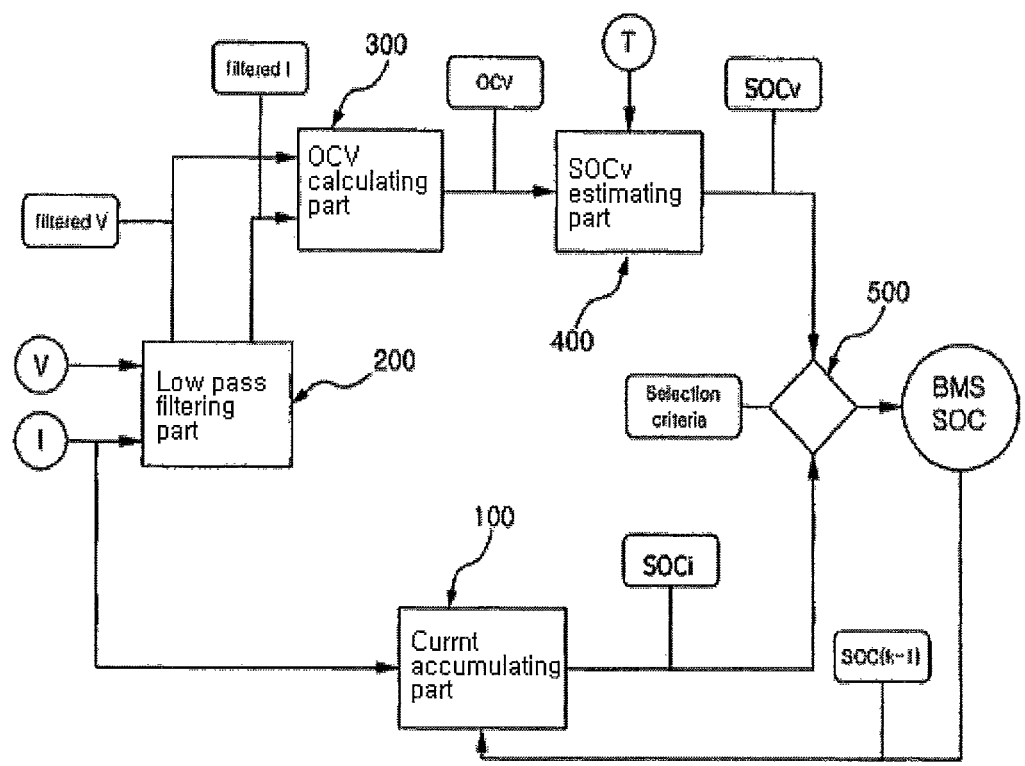
FIG. 3 is a block diagram of an apparatus for measuring SOC of a battery in accordance with an embodiment of the present invention.

FIG. 3 is a block diagram of an apparatus for measuring SOC of a battery in a battery management system in accordance with an embodiment of the present invention. Referring to FIG. 3, the apparatus for measuring SOC of a battery includes a battery information obtaining part (not shown), a current accumulating part 100, a low pass filtering part 200, an open circuit voltage calculating part 300, a SOCv estimating part 400 and a SOC setting part 500.

A process for calculating the SOC of a battery in the battery management system (hereinafter, called "BMS SOC") includes six steps as follows:

First step: collection of current and voltage data
Second step: calculation of SOCi through current accumulation
Third step: low pass filtering
Fourth step: equivalent circuit model and adaptive digital filtering
Fifth step: calculation of SOCv through open circuit voltage and temperature
Sixth step: proper selection of SOC.

The battery information obtaining part carries out the first step. That is, the battery information obtaining part collects current data, voltage data, temperature data and the like from the battery management system (BMS). The collected current data is transferred to the current accumulating part 100. In the current accumulating part 100, the current data is accumulated and then added to SOC (SOC(k−1) in FIG. 3) calculated in the previous sampling time, thereby calculating SOCi.

Further, the current data and the voltage data collected by the battery information obtaining part are transferred to the low pass filtering part 200. The low pass filtering part 200 filters the current data and the voltage data and then transfers them to the open circuit voltage calculating part 300. The open circuit voltage calculating part 300 calculates parameters used in the equivalent circuit model through the equivalent circuit model and an adaptive digital filtering, and then calculates open circuit voltage (OCV) using the parameters.

The SOCv estimating part 400 estimates SOCv using the temperature data and the OCV, and then transfers the estimated SOCv to the SOC setting part 500. The SOC setting part 500 sets up the SOCi calculated in the current accumulating part 100 or the SOCv estimated in the SOCv estimating part 400 to the BMS SOC according to a predetermined criteria. The detailed process performed in each part of the SOC measuring apparatus will be described below with reference to FIGS. 5 to 10.

Figure 4:
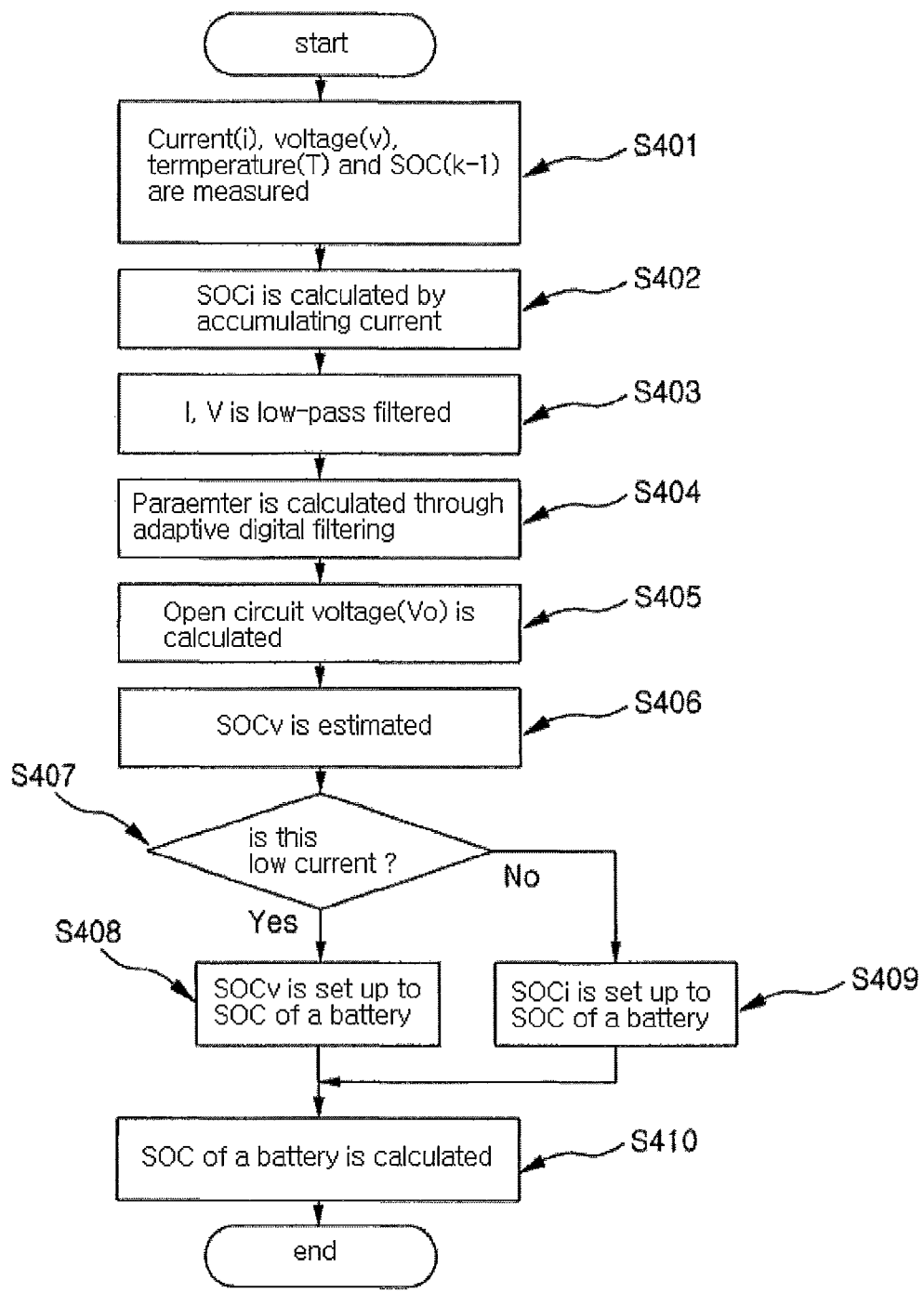
FIG. 4 is a flow chart of a method for measuring the SOC of the battery in accordance with an embodiment of the present invention.

FIG. 4 is a flow chart of a method for measuring the SOC of the battery in accordance with an embodiment of the present invention. The SOC measuring method will be described using the SOC measuring apparatus in FIG. 3.

Referring to FIG. 4, the battery information obtaining part measures the current data, the voltage data, the temperature data and the like of a battery pack in real time from the BMS (S401). And the current accumulating part 100 accumulates the current data and calculates the SOCi (S402). Then, the low pass filtering part 200 filters the current data and the voltage data (S403).

The filtered current data and voltage data are transferred to the OCV calculating part 300, and the OCV calculating part 300 calculates the parameters used in the equivalent circuit model through the adaptive digital filtering (S404) and calculates the OCV Vo using the parameters (S405). And the SOCv estimating part 400 estimates the SOCv using the OCV (S406).

Then, the SOC setting part 500 determines whether a low current state is maintained. If the low current state is maintained (S407), the SOCv is set up to the BMS SOC (S408), and if the low current state is not maintained (S407), the SOCi is set up to the BMS SOC (S409). The SOC of a battery in the battery management system is calculated through the above mentioned process (S410). Hereinafter, each step in the BMS SOC measuring method will be described in detail.

A. First Step: Collection of Current Data, Voltage Data, Temperature Data and the Like This step collects the current data, voltage data and the like from the BMS. In this step, the current data may be not measured precisely due to trouble of a current sensor. Particularly, in case that the current sensor does not measure precisely the current intensity, but measures only a rough value thereof, considerable error may occur in the current estimating process. However, in the SOC measuring method of the present invention, the error of SOCi is compensated with the SOCv. It was checked through an actual simulation whether the SOC measuring method of the invention exactly calculated the BMS SOC. As a result, since the error was gradually accumulated in the SOCi, but compensated with the SOCv, there was no problem in calculating the final BMS SOC. It was confirmed that an error between a calculated value and an actual value was within a target tolerance of 5.000% that was 1.502~−4.170%. That is, although the current was inaccurately measured due to the trouble of the current sensor, there was not a large error in the SOC measuring method of the invention.

Besides the trouble of the current sensor, other problems may occur. The current value may be offset owing to the trouble of the current sensor or trouble of CAN (controller Area Network), and then transferred.

Figure 5:
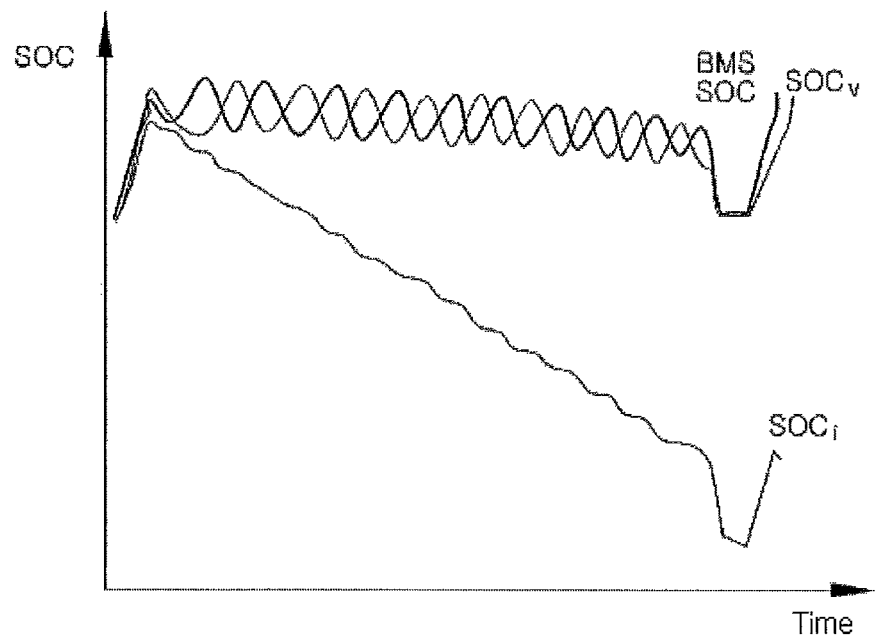
FIG. 5 is a graph shown a result of simulation in a case that offset of 1 A occurs in accordance with an embodiment of the present invention.

FIG. 5 is a graph shown a result of simulation in a case that offset of 1 A occurs in accordance with an embodiment of the present invention. As shown in FIG. 5, the error is accumulated in the SOCi. It is understood that the degree of accumulation is very large. The accumulation is caused by that 1 A is offset and calculated. However, it is also understood that the SOCv compensation occurs appropriately and thus the error does not occur considerably.

According to the whole analysis, since the SOCv compensation does not occur at beginning and end parts of a pattern, in which charging and discharging operations occur, there may be generated a problem in the BMS SOC. However, if the SOCv compensation occurs after the charging and discharging operations, it is possible to secure reliability of the calculation. Also, in case that offset of −1 A occurs, it is possible to secure the reliability thereof in the same way.

B. Second Step: Calculation of SOCi through Current Accumulation

In this step, the current data collected in the first step is accumulated and then added to the SOC calculated in the previous step, thereby calculating the SOCi. The calculation is carried out by integrating the current over time. A calculated result is divided by a whole capacity, and then the rest capacity is expressed in percentage. This may be expressed by an equation 1 as followed:

$$SOC(\%) = \frac{\text{Remaining Capacity (Ah)}}{\text{Nominal Capacity (Ah)}} \cdot 100 \quad \text{Equation 1}$$

$$SOC_i = \frac{\int i dt}{Ah_{nominal}} \cdot 100$$

In the SOC measuring method of the present invention, since the current is detected every second, the equation 1 may be expressed by an equation 2

$$SOC_i(k) = SOC(k-1) + \frac{1}{Q_{max}} \cdot I(k) \cdot t \qquad \text{Equation 2}$$

That is, the calculation of SOCi in a step k is performed by accumulating the current flowed in the step k to the SOC in a step k−1 with respect to a reference time of 1 second since the current flowed in the step k is divided by the whole capacity.

C. Third Step: Low Pass Filtering

The current data and the voltage data collected in the first step are passed through a low pass filter. The present invention employs a third order low pass filter, and a filter constant f is 0.6. However, the present invention is not limited to the conditions, and may use other kind of filters and other filter constants. The filter used in the present invention may be expressed in the form of an equation 3 as follows:

$$gi(n) = f^3 i + 3(1-f)gi(n-1) + 3(1-f)^2 gi(n-2) + (1-f)^3 gi(n-3) \qquad \text{Equation 3}$$

In the SOC measuring method of the present invention, there are total six kinds of current data and voltage data that are needed in an equivalent circuit model. The current data is used as it is, and the voltage data uses a difference value from an initial value. A current value, a differential value of the current and a second differential value of the current form one set of the current data. A difference value between an initial voltage value and a present voltage value, a first differential value thereof and a second differential value thereof form one set of the voltage data. Reasons why the differential data is required and the difference value of voltage is required will be fully described in the description of the equivalent circuit model.

D. Fourth Step: Equivalent Circuit Model and Adaptive Digital Filtering

1) Equivalent Circuit Model

In this step, the current data and the voltage data collected in the third step are applied to a battery model so as to obtain the OCV (open circuit voltage). This is caused by that it is possible to obtain the SOCv through the OCV. As the battery model, there is a first-principle model that considers thermal behavior and electrochemical phenomenon in a battery. However, since excessive time and cost are required to develop the above-mentioned model, the battery model in the present invention is embodied by an equivalent circuit model which is simply expressed by an electric circuit.

Figure 6:
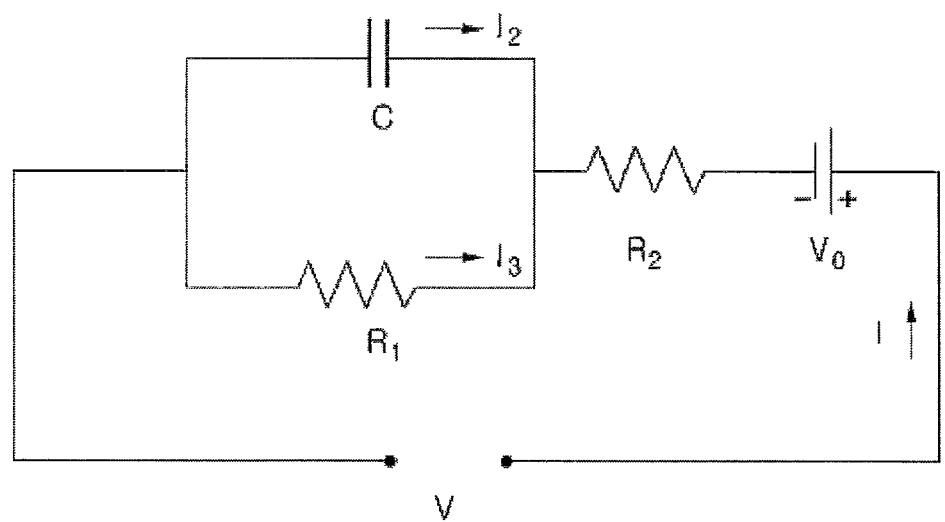
FIG. 6 is a view showing an equivalent circuit model in accordance with an embodiment of the present invention.

A modeling object is a lithium polymer battery (LiPB), and a circuit model is comprised of a first model. FIG. 6 is a view showing an equivalent circuit model in accordance with an embodiment of the present invention. The SOC measuring method of the present invention uses the equivalent circuit model that is expressed by a simple electric circuit. Each element such as a resistor and a capacitor included in the equivalent circuit model has a meaning shown in Table 1 as follows:

TABLE 1

Element of equivalent circuit model

| Step | Process |
|---|---|
| I | Current (charge: (+)/discharge(−)) |
| V | Terminal voltage |
| $V_o$ | Open circuit voltage (OCV) |
| $R_1$ | Lumped interfacial resistances |
| $R_2$ | Lumped series resistances |
| C | Electric double layer capacitor |

In FIG. 6, $R_2$ is resistance in an electrode, and $R_1$ and C are resistance and a capacitor that express an electric double layer generated at an interface between one electrode and the other electrode. Typically, a numerical value of each parameter is obtained through the first-principle model or an experiment. The equivalent circuit model of FIG. 6 may be expressed by an equation 4 as follows:

$$\Delta V = \Delta V_0 + \left( \frac{R_1 + R_2 + CR_1 R_2 s}{1 + CR_1 s} \right) I \qquad \text{Equation 4}$$

In the equation 4, it can be understood that the OCV is obtained by obtaining the parameters corresponding to each element forming the equivalent circuit model. In other words, an object of the battery modeling according to the present invention is to obtain the OCV by obtaining each parameter and substituting the obtained parameter in the equation 4.

The equation 4 may be derived through a process as follows. In the equivalent circuit model of FIG. 6, the current may be expressed in the form of an equation 5 by virtue of Kirchhoff's law.

$$I + I_2 + I_3 = 0 \qquad \text{Equation 5}$$

Further, when a model is set up in consideration of values of the resistance and the capacitor in the entire circuit, it may be expressed by an equation 6.

$$V = V_0 + IR_2 - I_3 R_1 \qquad \text{Equation 6}$$

$$V = V_0 + IR_2 - \frac{Q}{C}$$

$$I_2 = \frac{dQ}{dt}$$

Herein, when the voltage and the OCV are expressed by difference from an initial value (t=0), it may be expressed by an equation 7.

$$\Delta V = V(t) - V(0) \qquad \text{Equation 7}$$

$$\Delta V_0 = V_0(t) - V_0(0)$$

If the equation 7 is arranged in consideration of $\Delta V_0 = V_0(t) - V_0(0)$, it may be expressed by an equation 8.

$$\Delta V = \Delta V_0 + IR_2 - I_3 R_1 \qquad \text{Equation 8}$$

$$\Delta V = \Delta V_0 + IR_2 - \frac{Q}{C}$$

If the equation 8 is differentiated over time and then arranged, it may be expressed by an equation 9.

$$\frac{d(\Delta V - \Delta V_0)}{dt} + \frac{1}{CR_1}(\Delta V - \Delta V_0) = \frac{R_2}{CR_1} I + R_2 \frac{dI}{dt} + \frac{I}{C} \qquad \text{Equation 9}$$

Then, if it is converted using Laplace transform, it may be expressed by an equation 10.

$$\Delta V = \Delta V_0 + \left(\frac{R_1 + R_2 + CR_1 R_2 s}{1 + CR_1 s}\right)I \qquad \text{Equation 10}$$

Herein, assuming that the quantity of change in the current is proportional to the quantity of change in the OCV, and a proportional constant is h, the following equation may be set up:

$$\Delta V_0 = \frac{h}{s} I$$

If the equation is substituted in the equation 10, it may be expressed by an equation 11

$$\Delta V = \frac{(R_1 + R_2)s + CR_1 hs + h + CR_1 R_2 s^2}{(1 + CR_1 s)s} I \qquad \text{Equation 11}$$

Herein, each factor may be defined by an equation 12.

$\Delta V = V_1 \quad I = I_1$ $s\Delta V = V_2 \quad sI = I_2$ $s^2 \Delta V = V_2 s^2 \quad I = I_3 \qquad \text{Equation 12}$ If the defined factors are is substituted in the equation 11, it may be expressed by an equation 13

$V_2 = -CR_1 V_3 + CR_1 R_2 I_3 + (R_1 + R_2 + CR_1 h)I_2 + hI_1 \qquad \text{Equation 13}$ If the equation 13 is expressed in the form of a matrix, it may be expressed by an equation 14

$$V_2 = [\, V_3 \quad I_3 \quad I_2 \quad I_1 \,] \begin{bmatrix} -CR_1 \\ CR_1 R_2 \\ R_1 + R_2 + CR_1 h \\ h \end{bmatrix} \qquad \text{Equation 14}$$

Herein, factors relevant to the current and voltage may be obtained through the current data and voltage data that are collected from the BMS and filtered in the third step. Each parameter $R_1, R_2, C, h$ is obtained by substituting the obtained factors and using the adaptive digital filter. A method of using the adaptive digital filter will be described later. If the parameters related to each situation are obtained through the filter, they are substituted in an equation 15 that is a basic equation for calculating the OCV.

$$\Delta V_0 + CR_1 s \Delta V_0 = V_1 + CR_1 V_2 - CR_1 R_2 I_2 - (R_1 + R_2)I_1 \qquad \text{Equation 15}$$

$$\Delta V_0 = \frac{V_1 + CR_1 V_2 - CR_1 R_2 I_2 - (R_1 + R_2)I_1}{1 + CR_1 s}$$

The OCV obtained by using the equation 15 is used for calculating the SOCv in a next step.

The SOC measuring method of the present invention uses the above-mentioned equivalent circuit model. However, if an equation derived from the model is further integrated by one step, an equation 16 may be obtained.

$$\Delta V = \frac{CR_1 R_2 s + (R_1 + R_2) + h/s + CR_1 h}{CR_1 s + 1} I \qquad \text{Equation 16}$$

Figure 7:
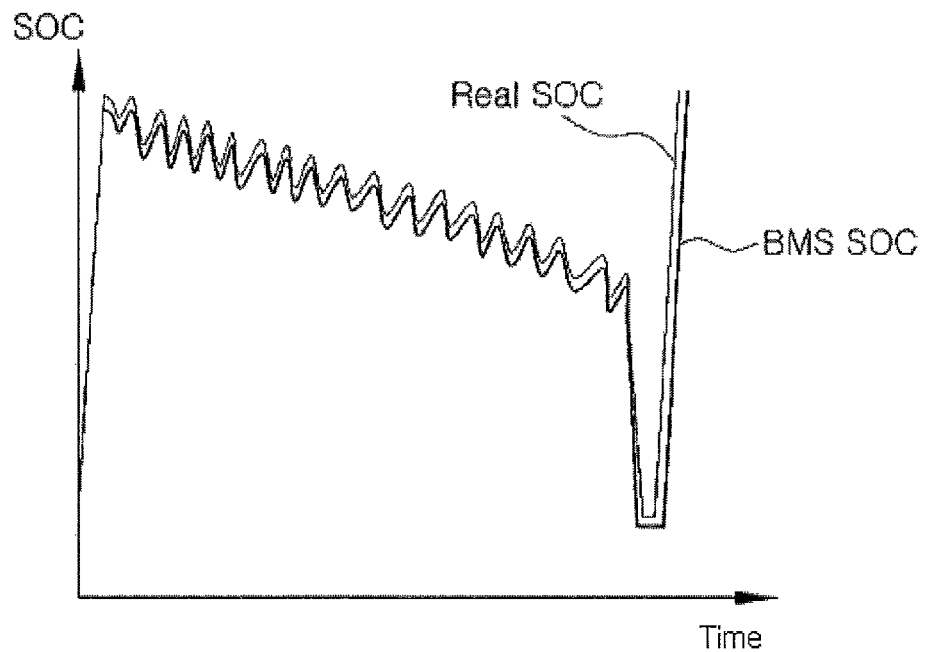
FIG. 7 is a graph showing actual SOC and calculated BMS SOC in case of using a model providing an integration effect in accordance with an embodiment of the present invention.
Figure 8:
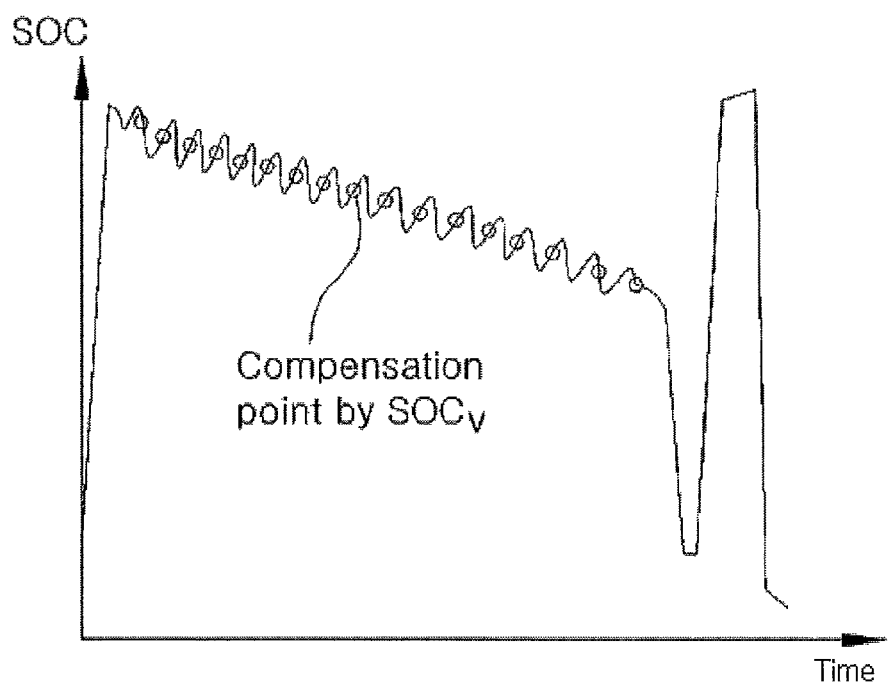
FIG. 8 is a graph showing a compensation point in case of using the model providing the integration effect in accordance with an embodiment of the present invention.

By dividing a denominator and a numerator of the original equation by s, it is possible to obtain integration effect. FIG. 7 shows actual SOC and calculated BMS SOC in case of using a model providing the integration effect, and FIG. 8 is a graph showing a compensation point in case of using the model providing the integration effect.

In case of using the equivalent circuit model of the present invention, the compensation occurs properly as a whole. If the model providing the integration effect is used, the compensation occurs further frequently. Also if the model providing the integration effect is used, noise is further generated, particularly, at a portion that the compensation occurs. This means that the data becomes unstable as a whole, when carrying out the integration. However, since the degree of unstable data is not high, it is possible to use the model providing the integration effect. Basically, it is the most preferable to use the equivalent circuit model of the present invention, but if necessary, the model providing the integration effect may be used.

(2) Adaptive Digital Filter

Like the equation 14, the equivalent circuit model may be expressed in the form of a matrix. In the equation 14, assuming that $$\begin{bmatrix} V_3 \\ I_3 \\ I_2 \\ I_1 \end{bmatrix}$$

is w, and $$\begin{bmatrix} -CR_1 \\ CR_1 R_2 \\ R_1 + R_2 + CR_1 h \\ h \end{bmatrix}$$

is θ, the equation 14 may be expressed by an equation 17.

$V_2 = w^{-1} \theta \qquad \text{Equation 17}$

In this matrix, w obtains through the third step in which the current data and the voltage data are passed through the low pass filter, and $V_2$ also obtains through the same result. An object of the adaptive digital filter is to obtain the matrix θ through the two values and estimate the parameter values in real time through each element. Assuming that $V_2$ passing through the low pass filter is $gV_2$, the equation 17 may be expressed by an equation 18.

$gV_2 = w^{-1} \theta \qquad \text{Equation 18}$

First of all, an initial value of the matrix θ is obtained by obtaining the parameter values in an initial state in which the current is not flowed and the voltage has an OCV value and then substituting the parameter values in the equation 18. A matrix at this time is indicated by $\theta_o$. A square of the matrix is expressed by an equation 19.

$P_0 = \theta_0^2 \qquad \text{Equation 19}$

Herein, a matrix K required to continuously renew the matrix θ may be defined as an equation 20.

$$K = \frac{P_0 \cdot w}{R + w^{-1} \cdot P_0 \cdot w} \quad \text{Equation 20}$$

wherein R is a value that is decided so as to prevent a denominator from being diverged to 0 by an initial value of $gV_2$, and the value is very small. The matrix may be arranged to an equation 21.

$$K = \frac{P_0 \cdot w}{R + w^{-1} \cdot P_0 \cdot w} = \frac{gV_2(n-1) \cdot \theta_0}{R + \{gV_2(n-1)\}^2} \quad \text{Equation 21}$$

wherein $gV_2(n-1)$ is a just previous value of $gV_2$. The continuous renewal of the matrix θ is occurred by proportional relationship like an equation 22.

$$\frac{\theta}{gV_2(n)} = \frac{\theta_0}{gV_2(n-1)} \quad \text{Equation 22}$$

The equation 22 may be arranged into an equation 23.

$$\theta = \theta_0 - \left[ \frac{gV_2(n-1) \cdot \theta_0}{\{gV_2(n-1)\}^2} \cdot \{gV_2(n-1) - gV_2(n)\} \right] \quad \text{Equation 23}$$

Since R is very small, the matrix K may be substituted. This is arranged into an equation 24.

$$\theta = \theta_0 - [K \cdot \{gV_2(n-1) - gV_2(n)\}] \quad \text{Equation 24}$$

If a relational expression is substituted in the equation 24, it may be expressed by an equation 25

$$\theta = \theta_0 - [K \cdot \{w^{-1} \cdot \theta_0 - gV_2(n)\}] \quad \text{Equation 25}$$

A value of θ in the equation 25 may be calculated through the current data, the voltage data and the previous matrix θ. Therefore, it is possible to continuously estimate each parameter. After the initial stage, the matrix θ and the matrix P are renewed with new calculated values. Then, the OCV is calculated through the obtained parameters.

E. Fifth Step: Calculation of SOCv through Open Circuit Voltage and Temperature

A value of the OCV is calculated through the equivalent circuit model according to the present invention. Generally, SOCv is influenced by the OCV and the temperature and thus expressed by a function between them. In a room temperature, relation between OCV and SOCv is equal to an equation 26.

$$SOC_v(n) = -539.069 \cdot V_0(n)^4 + 7928.96 \cdot V_0(n)^3 - \quad \text{Equation 26}$$
$$43513.3 \cdot V_0(n)^2 + 105698 \cdot V_0(n) - 95954.8$$

As described above, it is possible to obtain SOCv through the relation between OCV and SOCv and the value of OCV at the room temperature. However, there is a problem in the equation 50. Since it is a model at the room temperature, errors occur when the temperature is changed. A maximum value and a minimum value of the error generated when a simulation is performed at respective temperatures of 45 and −10° C. besides a room temperature of 25° C. are described in Table 2.

TABLE 2

Maximum and minimum error of each temperature simulation

| Temperature | Error (%) Max | Error (%) Min |
|---|---|---|
| 25° C. | 0.714 | −1.936 |
| 45° C. | 0.008 | −2.692 |
| −10° C. | 0.000 | −8.542 |

Therefore, using the relation between SOCv and OCV at the room temperature, it is possible to obtain precise values at a temperature of 45° C. However, it is understood that the values are incorrect at a temperature of −10° C. In other words, at the temperature of −10° C., it is necessary to use other relation or introduce a factor that considers the temperature. First of all, the relation between SOCv and OCV at the temperature of −10° C. is expressed by an equation 27.

$$SOC_v(n) = -425.6 \cdot V_0(n)^4 + 6207 \cdot V_0(n)^3 - \quad \text{Equation 27}$$
$$33740 \cdot V_0(n)^2 + 81113 \cdot V_0(n) - 72826$$

F. Sixth Step: Proper Selection of SOC

In the sixth step, it is decided which one is selected from SOCi and SOCv obtained in the previous step. In case of the low current state, it is known that SOCv has an exact value. Therefore, SOCv is used in the low current state. And the calculation is performed by accumulating the current value to the just previous SOC in other states.

In criteria of judgment of the low current state, if the current having a desired absolute value or less is continuously flowed for a desired period of time, it is determined as the low current state. Herein, the absolute value of current and the current flowing time are important criteria. Preferably, the absolute value and the time are 2 A and 20~60 s, respectively.

In case that the absolute value of current intensity is more than 2 A, the criteria of judgment of the low current state is relaxed considerably, and it is judged as a state that the current is being flowed even at a section that the current is not flowed. As a result, it is difficult to precisely estimate SOCv, and thus SOCv compensation is carried out too frequently. However, in case that the absolute value of current is less than 2 A, it is impossible to recognize the low current when offset occurs. Therefore, it is preferable to set up the criteria to 2 A.

It is more complicated to judge the criteria of current flowing time. Assuming that a period of time when the current corresponding to battery charging or discharging and having an intensity of 2 A or less is continuously flowed is t, the criteria may be expressed as in Table 3.

TABLE 3

Time scale criteria for SOCv compensation

| Continuous time criteria | Judgment |
|---|---|
| t < a | Use of SOCi |
| a ≤ t < b | Compensation with SOCv at the moment that low current section is ended |
| b ≤ t | SOCv compensation at a point of time of b seconds |

Figure 9:
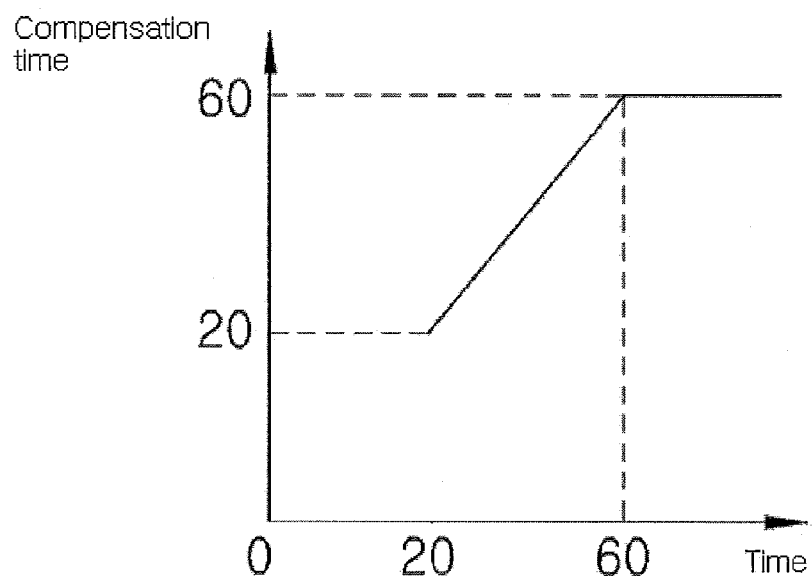
FIG. 9 is a graph showing a proposed time criteria in accordance with an embodiment of the present invention.

FIG. 9 shows the time criteria. Referring to FIG. 9, if the low current is flowed for 20 seconds or less, SOC is calculated by the current accumulation. However, if the low current is flowed for 20 seconds or more, the SOCv compensation occurs. The SOCv compensation is carried out at a point of time when the low current section having an intensity of 2 A or less is finished. However, if the low current is flowed for 60 seconds or more, the SOCv compensation is carried out at a point of time of 60 seconds. And at a moment that the compensation occurs, the continuous period of time when the low current is flowed is calculated again.

The criteria are decided by selecting the optimal time criteria from various simulations. The time criteria of minimum 20 seconds is decided based on a fact that the compensation is occurred even if the current sensor has a trouble. Actually, in case that the time criteria is changed into 10 seconds, an error of 8.3% occurs. Further, in case that the continuous period of time is set up to 60, the compensation does not occur properly at an up/down pattern, and the error is accumulated.

The main cause of allowing the time criteria to be movable is to prevent increase of the error due to improper compensation after the battery charging for a long time period. The present invention is not limited to the time criteria, and may include various time criteria.

Figure 10:
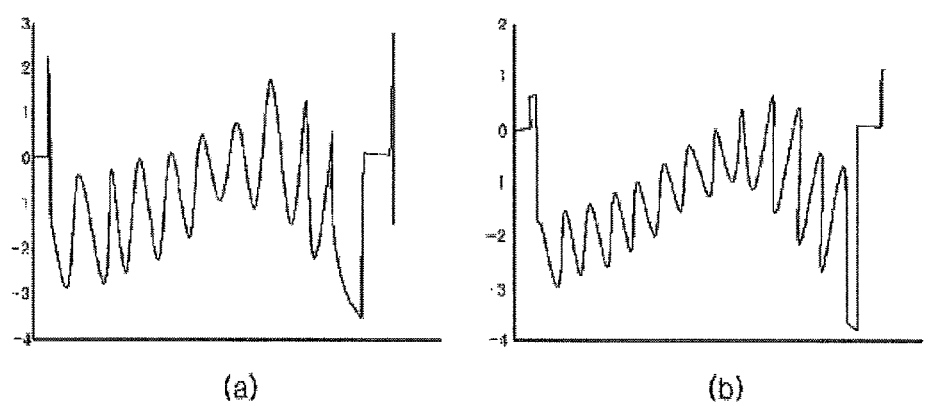
FIG. 10 is a graph showing an error in case of performing a simulation with a time criteria of 20 seconds and the proposed time criteria in accordance with an embodiment of the present invention.

FIG. 10($a$) shows an error in case of performing a simulation with a time criteria of 20 seconds, and FIG. 10($b$) shows an error in case of performing the simulation with a proposed time criteria.

Referring to FIG. 10, the utility of the proposed time criteria will be understood. In case of the simulation with a time criteria of 20 seconds, it was understood that considerable error occurred at beginning and end portions that are just after the charging. However, in case of the simulation with the proposed time criteria, the error did not occur at beginning and end portions. Entire error magnitude is hardly changed, but the error occurred at a point of time when the charging is finished is reduced by 1.5% or more.

The proposed time criteria is more effective in a low temperature state. In case of the low temperature state, it is generally effective, of cause, at the point of time when the charging is finished. In case of using the proposed time criteria, a maximum value of the error is reduced from 7.287% to 3.542%, and a minimum value thereof is reduced from −4.191% to −3.870%. This means that the proposed time criteria is more effective in a low temperature state.

If it is judged as the low temperature state on the basis of the time and current criteria, SOCv is set up to SOC.

Otherwise, BMS SOC is precisely calculated by using the SOC measuring method of the present invention.

As described above, the apparatus of measuring the SOC of the battery in accordance with one embodiment of the present invention judges the current state of the battery for a desired period of time and sets up the SOC of the battery using one of the SOCi and the SOCv.

Meanwhile, in the embodiment, in case that the SOCv is set up to the SOC, a value of the SOC may be sharply changed for a moment due to algorithm error or sensing noise of the current and voltage.

Therefore, in order to prevent the sharp change of the SOC due to the algorithm error or sensing noise of the current and voltage and guide the change in the SOC so as to be similar to the actual change in the SOC, an apparatus of measuring SOC of a battery in accordance with another embodiment of the present invention compensates the SOC measured at a present time (n+1) through the SOC measured at a previous time (n) and a predetermined algorithm.

Hereinafter, the method of compensating the SOC in the SOC measuring apparatus in accordance with another embodiment of the present invention will be described with reference to FIGS. 11 and 12.

Figure 11:
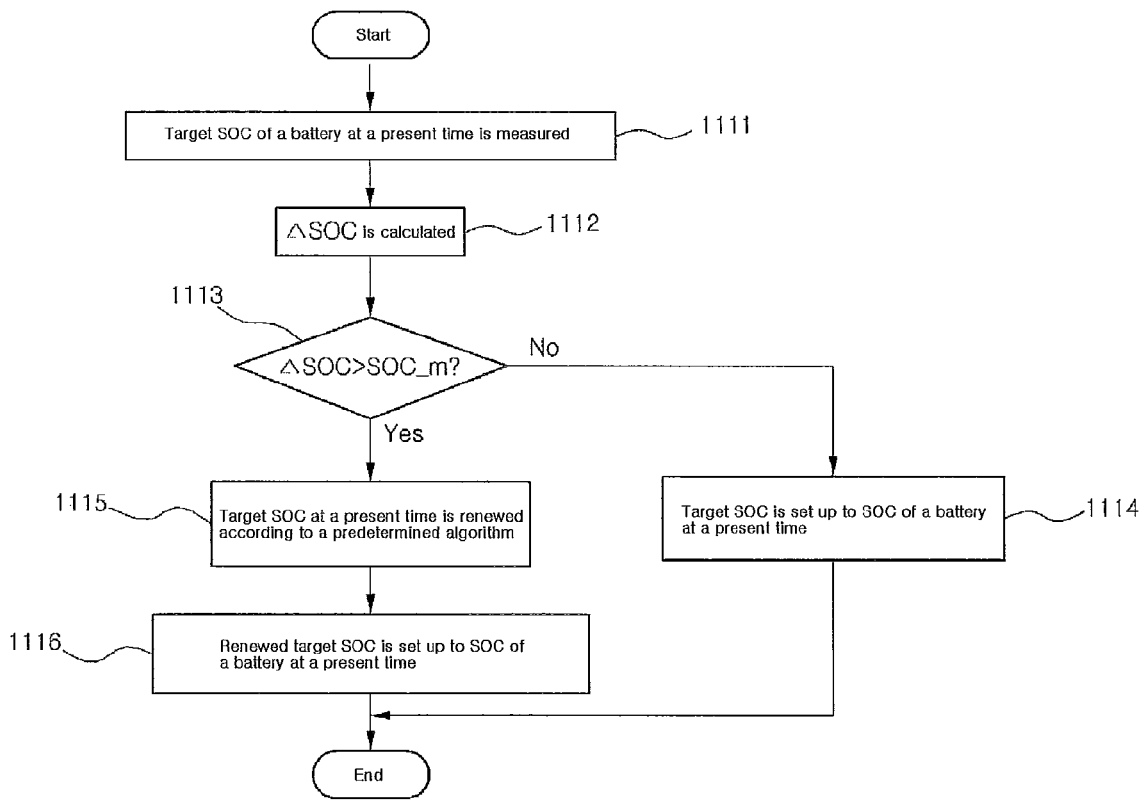
FIG. 11 is a flow chart of a method for measuring SOC of a battery in the apparatus of measuring the SOC of the battery in accordance with another embodiment of the present invention.

FIG. 11 is a flow chart of a method for measuring SOC of a battery in the apparatus of measuring the SOC of the battery in accordance with another embodiment of the present invention.

A SOC setting part 500 according to another embodiment of the present invention sets up the SOC measured at the present time (n+1) to target SOC (S1111). The target SOC may be SOC set by the method of FIGS. 3 and 4, or may include all SOCs set by various methods that are widely used in the art.

The SOC setting part 500 calculates a difference $\Delta$SOC between the target SOC at the present time and the SOC at the previous time by using an equation 28 (S1112).

$$\Delta SOC = SOC\_target(n+1) - SOC(n) \qquad \text{Equation 28}$$

The SOC setting part 500 compares the $\Delta$SOC with a first critical value SOC_m (S1113). The first critical value may be set up to a maximum change value of the SOC per SOC calculation period. Further, the first critical value may be set up to various values according to a current limit value set by those skilled in the art.

In comparison result of S1113, if the $\Delta$SOC is not greater than the first critical value SOC_m, the SOC setting part 500 sets up the target SOC to the SOC of the battery at the present time (S1114).

In comparison result of S1113, if the $\Delta$SOC is greater than the first critical value SOC_m, the SOC setting part 500 renews the target SOC according to the selected algorithm (S1115). The algorithm is expressed by an equation 29.

$$SOC(n+1) = SOC(n) + \Delta SOCi + gain \times \Delta SOC \qquad \text{Equation 29}$$

In the equation 29, SOC(n+1) means SOC of the battery at the present time, and SOC(n) means SOC of the battery at the previous time. Further, in the equation 29, the $\Delta$SOCi may be calculated by an equation "$\Delta SOCi = I(n+1)*Ts/Capa*100\%$". In the equation, I(n+1) is a current value at the present time, Ts is a current sampling period, and Capa is a rated capacity of the battery. Furthermore, in the equation 29, it may be 0(%/100 msec)<gain<0.1(%/100 msec). The 'gain' may have a value within the above range as well as various values according to judgment or requirement by those skilled in the art.

In case that the target SOC is renewed through S1115, the SOC setting part 500 sets up the renewed target SOC to the SOC at the present time (S1116).

Figure 12:
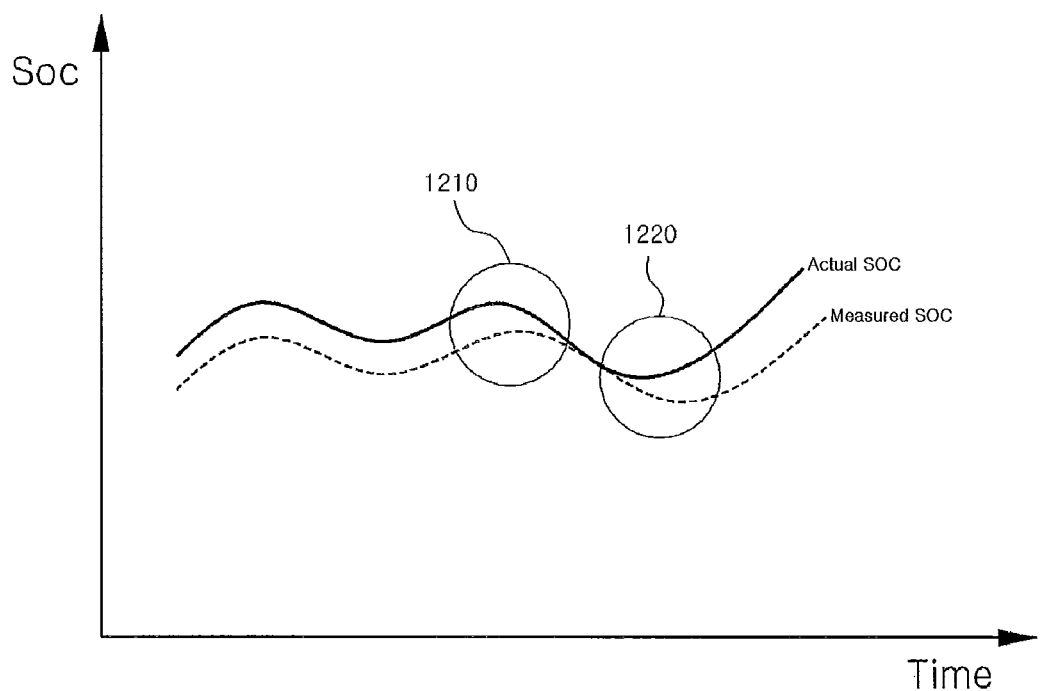
FIG. 12 is a graph showing a comparing result between an actual SOC and a measured SOC when a method of compensating the SOC in the apparatus of measuring the SOC of the battery in accordance with another embodiment of the present invention.

FIG. 12 is a graph showing a comparing result between an actual SOC and a measured SOC when a method of compensating the SOC in the apparatus of measuring the SOC of the battery in accordance with another embodiment of the present invention.

As shown in FIG. 12, the measured SOC is gently changed without the sharp change at first and second sections 1210 and 1220 in which the actual SOC and the measured SOC are intersected with each other.

As described above, since the sharp change of the SOC due to the SOC calculation error in the battery management system is compensated by the method for compensating the SOC of the present invention, it is possible to precisely measure the SOC. In case that the battery management system is installed in a hybrid vehicle, the battery management system transfers the precise SOC information to HCU (Hybrid Control Unit), and thus the SOC may be smoothly controlled by the HCU, thereby providing a comfortable ride.

The present application contains subject matter related to Korean Patent Application Nos. 2008-0003345 and 10-2009-0094481, filed in the Korean Intellectual Property Office on Jan. 11, 2008 and Sep. 26, 2009, respectively, the entire contents of which are incorporated herein by reference.

While the present invention has been described with respect to the specific embodiments, it will be apparent to those skilled in the art that various changes and modifications may be made without departing from the spirit and scope of the invention as defined in the following claims.

[Industrial Applicability]

The SOC measuring method of the present invention may be embodied in the form of a program that is executed through various computing means, and then recorded on a computer-readable medium. The computer-readable medium may include a program order, a data file, a data structure and the like, or any combination thereof. The program order recorded on the medium may be specially designed or constructed to be used in the present invention, or used in a state that is provided to those skilled in the field of computer software. Further, the computer-readable medium may include a magnetic media such as a hard disk, a floppy disk and a magnetic tape, an optical media like DVD, a magnetro-optical media like a floptical disk, and a hardware device for storing and executing a program order, such as ROM, RAM and a flash memory. The medium may be a transmission media of a wave guide, a metal wire or light including a carrier wave for transmitting a signal indicating a program order, a data structure and the like. The program order includes a machine language code formed by a compiler as well as a high level language code that is formed using an interpreter so as to be executed by a computer. In order to perform an operation of the present invention, the hardware device may be constructed to be operated by one or more software modules, and the reverse thereof is the same.

The invention claimed is:

1. A method for measuring SOC (State Of Charge) of a battery in a battery management system, comprising:
obtaining, by a battery information obtaining part, current data, voltage data and temperature data by measuring current, voltage and temperature of the battery;
calculating, by a current accumulating part, SOCi (State Of Charge based on current) by accumulating the current data;
calculating, by a OCV (Open Circuit Voltage) calculating part, OCV using an equivalent circuit model in which the current data, the voltage data and the battery are simply expressed by an electric circuit;
estimating, by a SOCv (State Of Charge based on voltage) estimating part, SOCv using the temperature data and the OCV; and
judging, by a SOC setting part, a current state of the battery for a desired period of time, and setting up, by the SOC setting part, the SOC of the battery using at least one of the SOCv and the SOCi,
wherein the judging of the current state of the battery for the desired period of time, and the setting of the SOC of the battery using at least one of the SOCv and the SOCi, by the SOC setting part, comprises:
judging the current state of the battery for the desired period of time, and measuring target SOC of the battery using at least one of the SOCv and the SOCi;
calculating $\Delta$SOC which is a difference between the target SOC at a present time and the SOC at a previous time;
comparing the $\Delta$SOC with a first critical value;
renewing the target SOC at the present time according to a predetermined algorithm and then setting up the renewed target SOC to the SOC of the battery at the present time, if the $\Delta$SOC is larger than the first critical value; and
setting up the target SOC at the present time to the SOC of the battery at the present time, if the $\Delta$SOC is not larger than the first critical value, and
wherein the algorithm is $SOC(n+1)=SOC(n)+\Delta SOCi+\text{gain} X \Delta SOC$, –$SOC(n+1)$: SOC of the battery at the present time;
–$SOC(n)$: SOC of the battery at the previous time;
–$\Delta SOCi=I(n+1)*Ts/Capa*100\%$;
–($I(n+1)$ is a current value at the present time, and Ts is a current sampling period, and Capa is a rated capacity of the battery);
–$0(\%/100\text{ msec})<\text{gain}<0.1(\%/100\text{ msec})$; and
–$\Delta$SOC is a value produced by subtracting the SOC measured at a previous time (n) from the SOC measured at a present time (n+1).

2. The method of claim 1, wherein the calculating of OCV by the OCV calculating part comprises:
filtering the current data and the voltage data using a low pass filter;
calculating a parameter used in the equivalent circuit model by applying the filtered current data and voltage data to the equivalent circuit model and an adaptive digital filter; and
calculating the OCV using the parameter.

3. The method of claim 2, wherein the low pass filter is a third order low pass filter,
the equivalent circuit model is expressed by an electric circuit using a resistance parameter R, a current parameter I, a capacitor parameter C, a terminal voltage parameter V and OCV parameter Vo, and
the adaptive digital filter continuously renews a value of the parameter used in the equivalent circuit model.

4. The method of claim 1, wherein the SOCv is set up by the SOC setting part to the SOC of the battery if the battery is in a low current state for the desired period of time, and wherein the SOCi is set up by the SOC setting part to the SOC of the battery if the battery is in other states.

5. The method of claim 4, wherein the desired period of time is 20~60 seconds, and the low current criteria is 2A.

6. The method of claim 1, wherein the first critical value is a maximum change value of the SOC per SOC calculation period, and also set up, by the SOC setting part, to various values according to a current limit value.

7. A method for measuring SOC (State Of Charge) of a battery in a battery management system, comprising:
measuring target SOC of the battery at a present time by measuring current, voltage and temperature of the battery;
calculating, by a SOC setting part, $\Delta$SOC which is a difference between the target SOC at the present time and the SOC at a previous time;
comparing, by the SOC setting part, the $\Delta$SOC with a first critical value;
renewing, by the SOC setting part, the target SOC at the present time according to a predetermined algorithm and then setting up the renewed target SOC to the SOC of the battery at the present time, if the $\Delta$SOC is larger than the first critical value; and
setting up, by the SOC setting part, the target SOC at the present time to the SOC of the battery at the present time, if the $\Delta$SOC is not larger than the first critical value,
wherein the algorithm is $SOC(n+1)=SOC(n)+\Delta SOCi+\text{gain } X \Delta SOC$,

- SOC(n+1): SOC of the battery at the present time;
- SOC(n): SOC of the battery at the previous time;
- $\Delta SOCi = I(n+1) * Ts/Capa * 100\%$;
- I(n+1) is a current value at the present time, and Ts is a current sampling period, and Capa is a rated capacity of the battery);
- $0(\%/100\ msec) < gain < 0.1(\%/100\ msec)$; and
- $\Delta SOC$ is a value produced by subtracting the SOC measured at a previous time (n) from the SOC measured at a present time (n+1).

8. The method of claim 7, wherein the measuring of the target SOC of the battery at the present time by measuring current, voltage and temperature of the battery comprises:

obtaining, by a battery information obtaining part, current data, voltage data and temperature data by measuring the current, voltage and temperature of the battery;

calculating, by a current accumulating part, SOCi (State Of Charge based on current) by accumulating the current data;

calculating, by a OCV (Open Circuit Voltage) calculating part, OCV using an equivalent circuit model in which the current data, the voltage data and the battery are simply expressed by an electric circuit;

estimating, by a SOCv (State Of Charge based on voltage) estimating part, SOCv using the temperature data and the OCV; and judging, by the SOC setting part, a current state of the battery for a desired period of time, and setting up, by the SOC setting part, the SOC of the battery using at least one of the SOCv and the SOCi.

9. The method of claim 7, wherein the first critical value is a maximum change value of the SOC per SOC calculation period, and also set up to various values according to a current limit value.

10. A battery management system, comprising:

a battery information obtaining part that measures current, voltage and temperature of the battery and obtains current data, voltage data and temperature data;

a current accumulating part that calculates SOCi by accumulating the current data;

a OCV calculating part that calculates OCV using an equivalent circuit model in which the current data, the voltage data and the battery are simply expressed by an electric circuit;

a SOCv estimating part that estimates SOCv using the temperature data and the OCV; and a SOC setting part that judges a current state of the battery for a desired period of time, and sets up the SOC of the battery using at least one of the SOCv and the SOCi, wherein the SOC setting part judges a current state of the battery for a desired period of time and measures target SOC of the battery using at least one of the SOCi and SOCv; calculates $\Delta SOC$ which is a difference between the target SOC at the present time and the SOC at a previous time; compares the $\Delta SOC$ with a first critical value; renews the target SOC at the present time according to a predetermined algorithm and then setting up the renewed target SOC to the SOC of the battery at the present time if the $\Delta SOC$ is larger than the first critical value; and sets up the target SOC at the present time to the SOC of the battery at the present time if the $\Delta SOC$ is not larger than the first critical value, and wherein the algorithm is $$SOC(n+1) = SOC(n) + \Delta SOCi + gain X \Delta SOC,$$

- SOC(n+1): SOC of the battery at the present time;
- SOC(n): SOC of the battery at the previous time;
- $\Delta SOCi = I(n+1) * Ts/Capa * 100\%$;
- I(n+1) is a current value at the present time, and Ts is a current sampling period, and Capa is a rated capacity of the battery);
- $0(\%/100\ msec) < gain < 0.1(\%/100\ msec)$; and
- $\Delta SOC$ is a value produced by subtracting the SOC measured at a previous time (n) from the SOC measured at a present time (n+1).

11. The battery management system of claim 10, further comprising a low pass filtering part that filters the current data and the voltage data using a low pass filter, wherein the OCV calculating part applies the current data and the voltage data filtered by the low pass filtering part to the equivalent circuit model and an adaptive digital filter, calculates a parameter used in the equivalent circuit model and then calculates the OCV using the parameter.

12. The battery management system of claim 11, wherein the low pass filter is a third order low pass filter, the equivalent circuit model is expressed by an electric circuit using a resistance parameter R, a current parameter I, a capacitor parameter C, a terminal voltage parameter V and OCV parameter Vo, and the adaptive digital filter renews a value of the parameter using in the equivalent circuit model, continuously.

13. The battery management system of claim 10, wherein the SOCv is set up to the SOC of the battery if the battery is in a low current state for the desired period of time, and wherein the SOCi is set up to the SOC of the battery if the battery is in other states.

14. The battery management system of claim 13, wherein the desired period of time is 20~60 seconds, and the low current criteria is 2A.

15. The battery management system of claim 10, wherein the first critical value is a maximum change value of the SOC per SOC calculation period, and also set up to various values according to a current limit value.

* * * * *

UNITED STATES PATENT AND TRADEMARK OFFICE
CERTIFICATE OF CORRECTION

PATENT NO. : 8,548,761 B2  Page 1 of 1
APPLICATION NO. : 12/812163
DATED : October 1, 2013
INVENTOR(S) : Lim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 397 days.

Signed and Sealed this

Fifteenth Day of September, 2015

Michelle K. Lee
*Director of the United States Patent and Trademark Office*